United States Patent [19]

Geddes

[11] Patent Number: 5,317,286
[45] Date of Patent: May 31, 1994

[54] POWER COMBINING OSCILLATOR

[75] Inventor: John J. Geddes, Minneapolis, Minn.

[73] Assignee: Honeywell Inc., Minneapolis, Minn.

[21] Appl. No.: 973,350

[22] Filed: Nov. 9, 1992

[51] Int. Cl.$^5$ .................... H03B 27/00; H03B 5/00
[52] U.S. Cl. .................... 331/56; 331/107 P;
331/96; 331/108 C; 331/117 D
[58] Field of Search .............. 331/55, 56, 96, 108 C,
331/108 R, 107 P, 117 D, 107 DP, 117 FE;
333/230; 330/53, 56

[56] References Cited

U.S. PATENT DOCUMENTS

| | | | |
|---|---|---|---|
| 3,875,513 | 4/1975 | Strull et al. | 331/107 X |
| 4,496,913 | 1/1985 | Wandinger et al. | 331/56 |
| 4,547,750 | 10/1985 | Torizuka et al. | 331/99 |
| 4,583,055 | 4/1986 | Yen et al. | 331/55 |
| 4,742,314 | 5/1988 | Mink | 331/56 |
| 4,768,079 | 8/1988 | Kandpal et al. | 331/107 X |
| 4,951,006 | 8/1990 | Cohen | 331/74 |
| 5,214,394 | 5/1993 | Wong | 330/286 |

OTHER PUBLICATIONS

Inter-Injection-Locked Oscillators for Power Combining and Phased Arrays by Karl D. Stephan, IEEE MTT-34, No. 10 Oct. 1986.

"Quasi-Optical Power Combining of Solid-State Millimeter-Wave Sources," by J. W. Mink, pub. IEEE Transactions on Microwave Theory and Techniques, vol. MTT-34, No. 2, Feb. 1986, pp. 273–279.

"A 100-MESFET Planar Grid Oscillator," by Z. B. Popovic et al., pub. in IEEE Transactions on Microwave Theory and Techniques, vol. 39, No. 2, Feb. 1991, pp. 193–199.

Primary Examiner—Robert J. Pascal
Assistant Examiner—Arnold Kinkead
Attorney, Agent, or Firm—John G. Shudy, Jr.

[57] ABSTRACT

An array of unit oscillators interconnected with one another in that the transistors of the oscillators are connected to common lines. Separate lines in proximity provide coupling capacitance for feedback to sustain the oscillation of the unit oscillators. The separate lines also form a grid which results in an antenna for emanation of the oscillators, radiation The array can effectively function at extremely high frequencies (i.e., greater than 30 GHz). The array is specially designed to accommodate monolithic implementation.

13 Claims, 7 Drawing Sheets

POWER COMBINING OSCILLATOR

FIELD OF THE INVENTION

The invention pertains to microwave power combiners using two-dimensional arrays of solid state devices. The invention more particularly pertains to solid-state power combining arrays utilizing oscillator feedback.

BACKGROUND OF THE INVENTION

Related art pertaining to a power combining oscillator array at lower frequencies has involved individual gate, source and drain grid lines to separate the direct current (DC) bias feeds for the field effect transistors (FETs) in the oscillator array. In the array, a high power output is provided by coupling together and synchronizing all of the individual oscillators in the array. The coupling for providing the feedback needed for sustaining oscillation is constituted of and controlled by the width of the lines and the spacing between each pair of lines in the grid of the array. The grid spacing is determined and, in turn, restricted by antenna requirements of the array. Problems that arise with such an array at higher frequencies (i.e., >30 GHz) include decreased FET gains which provide insufficient feedback to sustain oscillation.

SUMMARY OF THE INVENTION

The present invention obviates the aforementioned problems of the related art with features of a structure that improve the coupling for providing feedback in that an increase of coupling is attained and control of coupling is effected independently of the grid spacing and the antenna requirements. To achieve these features, each oscillator has the gate line situated over the drain bias line with a dielectric between the lines to form a coupling capacitor which provides the desired feedback. However, the positions of the gate and drain lines may be reversed depending on design preferences Also, the invention has a feature which permits forming an oscillator having more than one FET. .A plurality of FETs is a basis for increasing oscillator loop gain. The invention may also incorporate other kinds of three terminal devices such as heterojunction bipolar transistors.

Monolithic fabrication techniques provide a practical method for implementation of the present invention. Other fabrication techniques may also be used.

DESCRIPTION OF THE PREFERRED EMBODIMENT

Figure 1A:
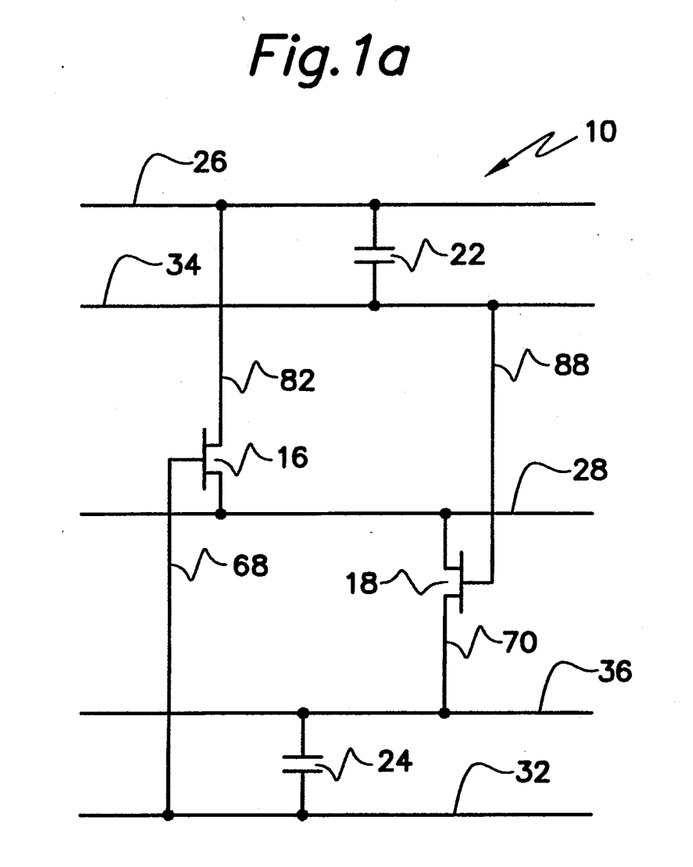
FIGS. 1a and 1b are schematics of a unit cell oscillator.
Figure 1B:
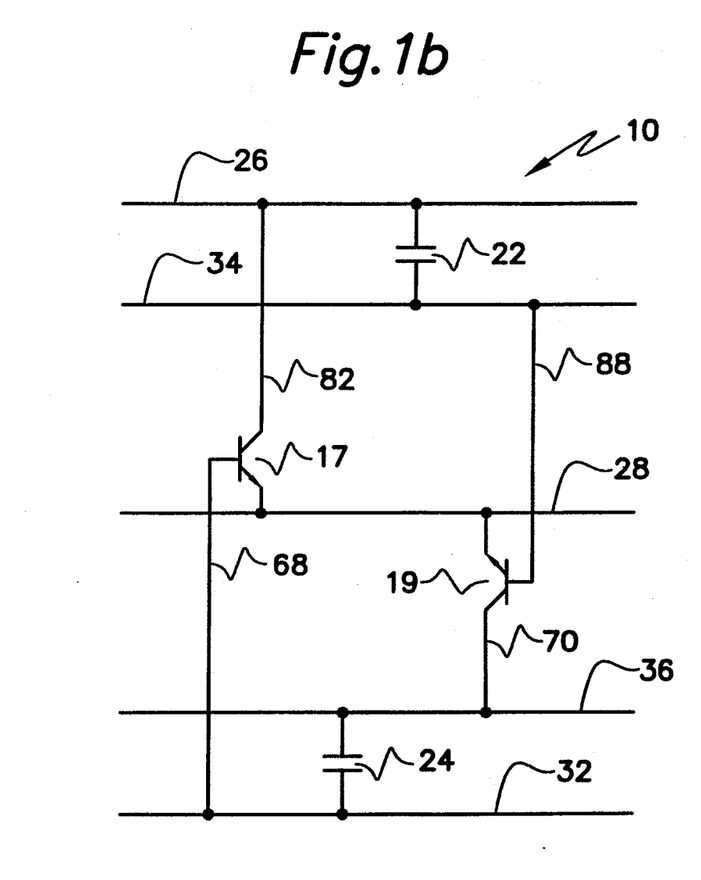
Figure 2A:
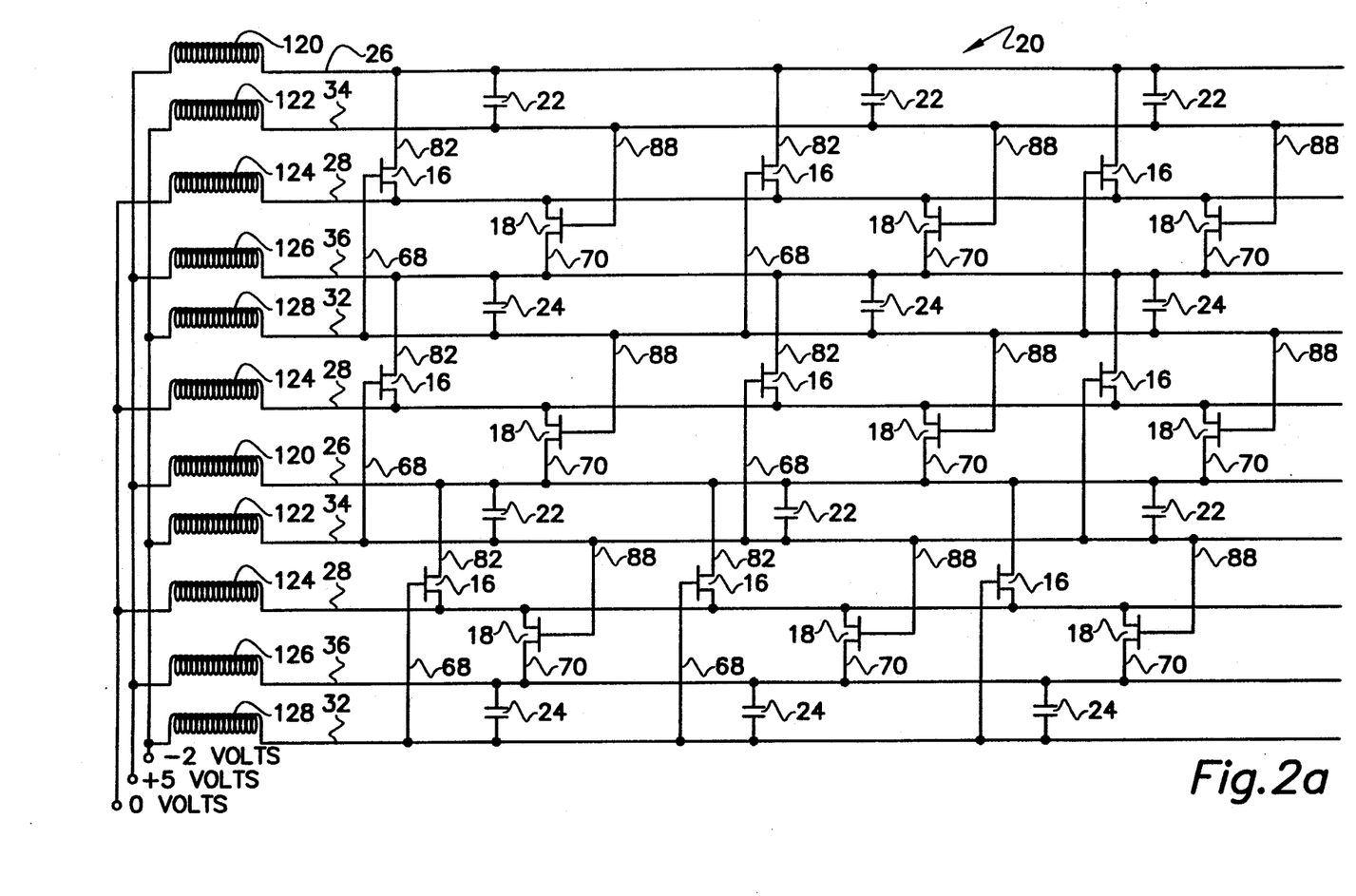
FIGS. 2a and 2b are schematics of the powercombining array.
Figure 2B:
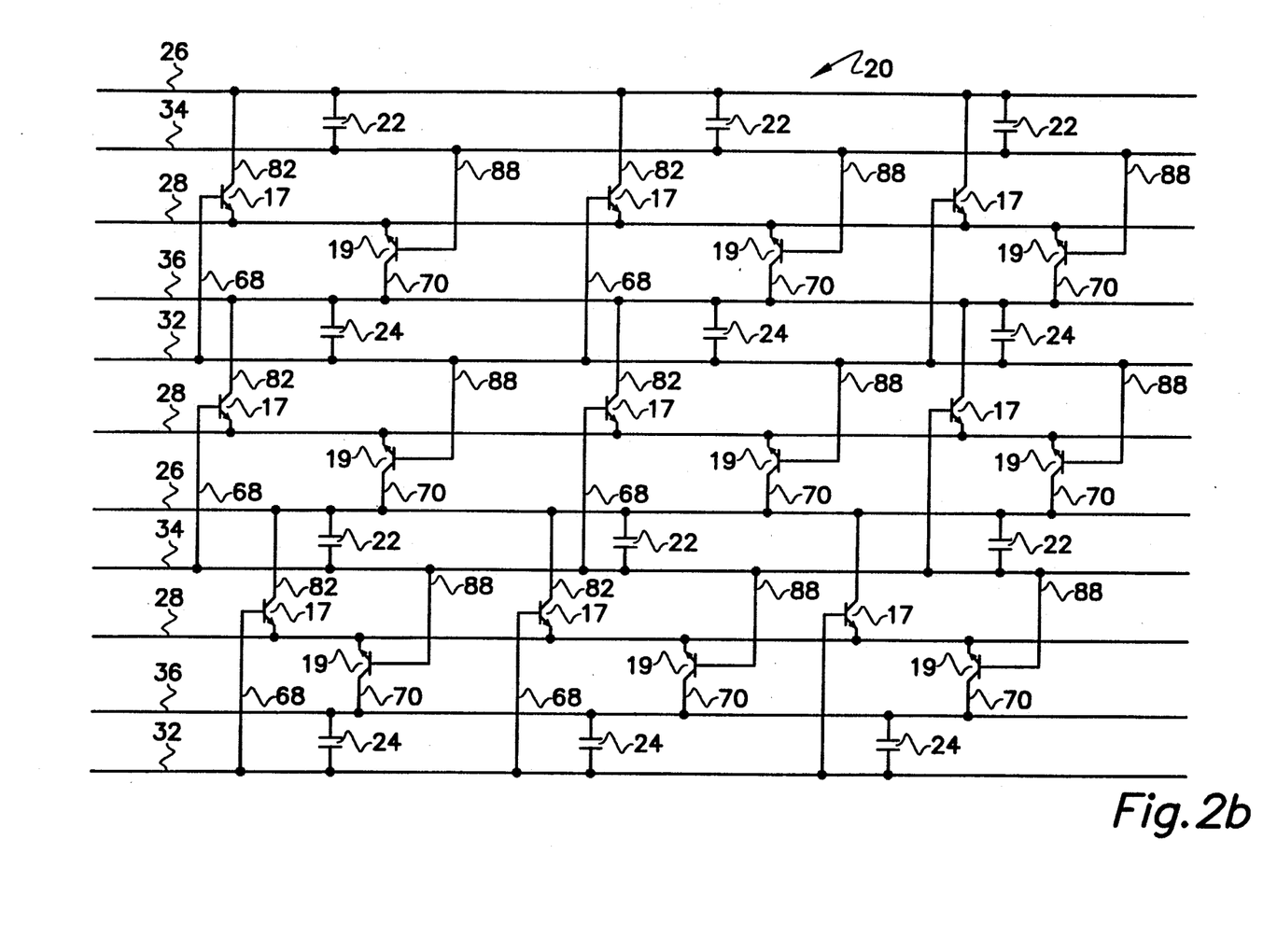
Figures 3, 5A:
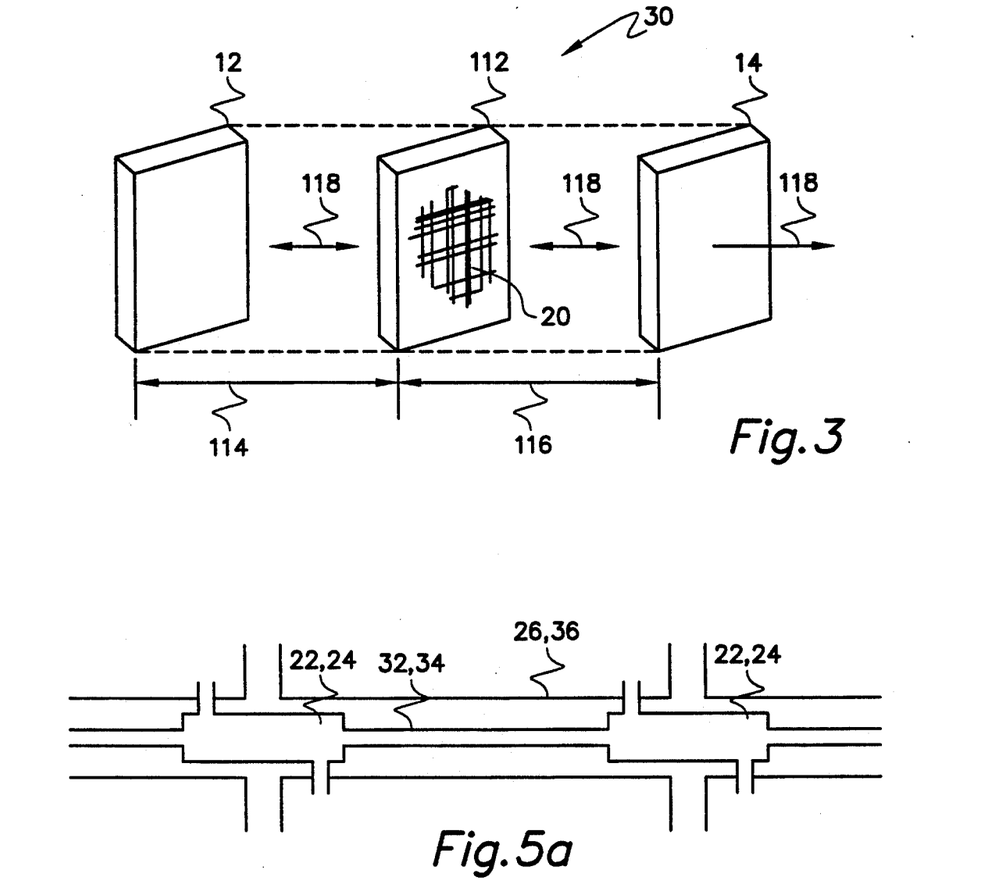
FIG. 3 shows the power-combining array placed in a Fabry-Perot resonator.
FIG. 5a and 5b reveal the capacitor construction.

An instance of the invention is an improved oscillator 10 as shown in FIGS. 1a and 1b which is used in a power combining array 20 of FIGS. 2a and 2b. Array 20 is placed in a Fabry-Perot resonator 30 as shown in FIG. 3. Resonator 30 has a metal mirror 12 in back of array 20 and a semi-transparent mirror 14 in front of array 20. Emission 118 from the resonator is out through mirror 14. The large surfaces of mirrors 12 and 14 are parallel to that of grid 20. The distances 114 and 114 between mirrors 12 and 14 and grid 20 are set in accordance with the resonant frequency of the Fabry-Perot resonator. The gain of oscillator 10 may be sufficient so as to eliminate the need for mirror 14.

Transistor 16 of FIG. 1a has a drain connected to drain line 26 and a source is connected to source line 28. The gate of field effect transistor 16 is connected to gate line 32. The gate of transistor 18 is connected to gate line 34 and the drain is connected to drain line 36. The source of transistor 18 is connected to line 28. Capacitor 22 provides a coupling between gate line 34 and drain line 26. In addition, there is coupling between lines 26 and 34 which is effected by the proximity of lines 26 and 34. Likewise, capacitor 24 provides coupling between gate line 32 and drain line 36. Additional coupling is effected by the proximity of the lines in the actual construction of oscillator array 20. The signals on the drain lines from transistor 16 is sent to gate line 34 which passes the signal onto transistor 18 which provides an amplified signal to drain line 36 which in turn is capacitively coupled by capacitance 24 to base line 32 which is fed to transistor 16 and in turn provides a signal onto drain line 26, and so on. FIG. 1b shows the same configuration using bipolar transistors 17 and 19. Even though the transistors 17 and 19 of FIGS. 1b, 2b and 4b are NPN, transistors 17 and 19 may also be PNP.

Figure 4A:
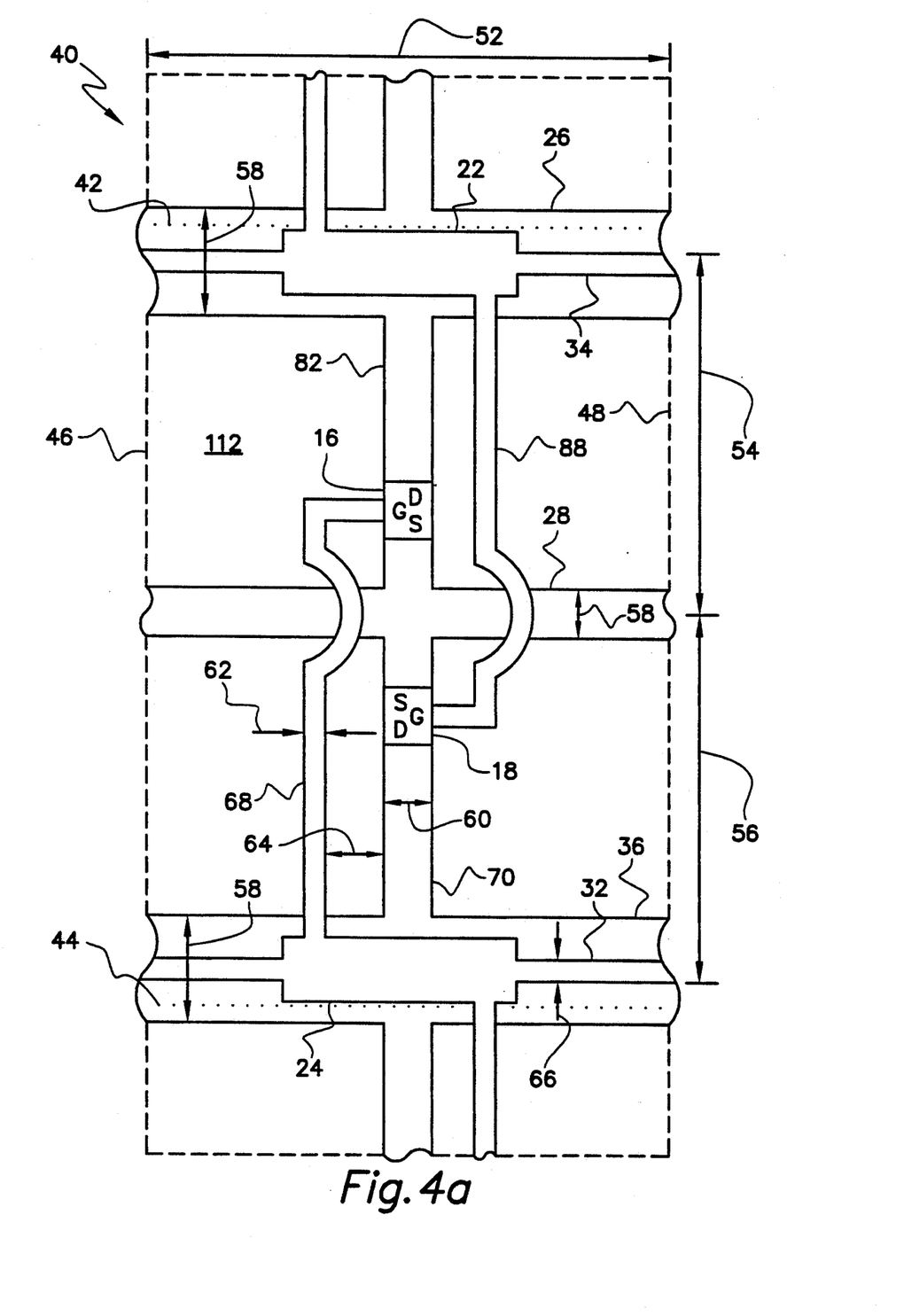
FIGS. 4a and 4b are integrated circuit layouts of the unit cell oscillator.
Figure 4B:
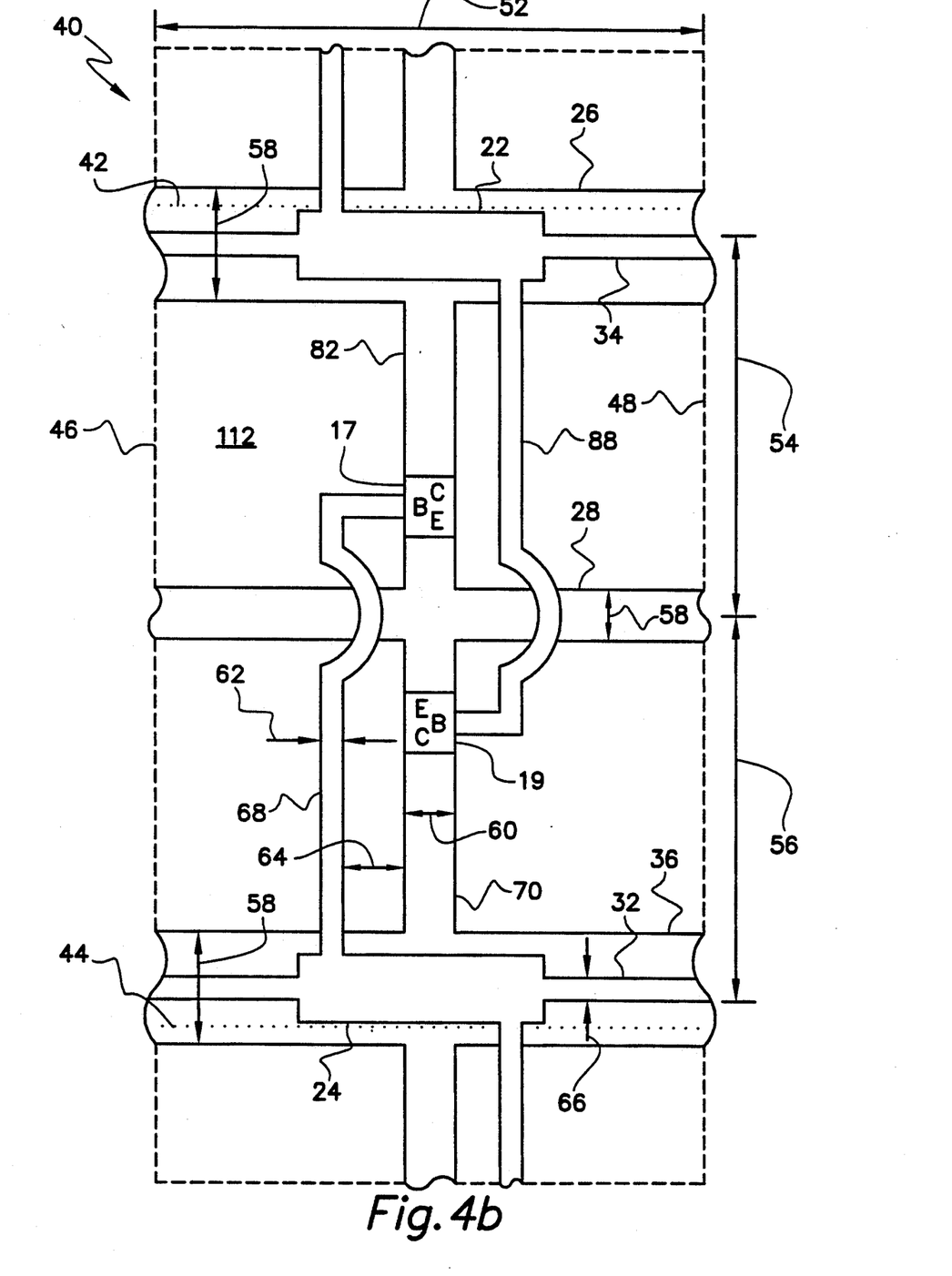

FIGS. 4a and 4b illustrate an integrated circuit unit section 40 of oscillator grid array 20. Unit cell 40 is defined by assuming an infinite grid. The symmetry of grid 20 imposes boundary conditions which define unit cell 40. Boundary conditions are an electric wall (the tangential electric field is zero) as indicated by dotted lines 42 and 44 on the top and bottom and a magnetic wall (tangential magnetic field is zero) is indicated by the dashed lines 46 and 48 on the sides. This reduces the analysis of grid 20 to that of an analysis of a waveguide. The dimensions required for grid construction are unit cell 40 dimensions 52, 54 and 56 and the width of the conducting lines of array 20 which are shown as dimensions 58, 60 and 62, and the spacing between lines 68 and 70 which is dimension 64. Dimensions 52, 54 and 56 are chosen appropriately for the intended operating frequency of the cell. Typically, dimension 52 is chosen to be from 1/8 to 1/10 of the free space wavelength of the operating frequency. For operation at 35 GHz, dimension 52 would be about one millimeter. Dimensions 54 and 56 are about ½ of the magnitude of dimension 52. The width 58 of array lines 26, 28 and 36 would be about 25 to 50 microns for 35 GHz. Dimensions 60, 62 and 64 are chosen to effect feedback between FETs 16 and 18 in FIG. 4a which form oscillator 10 in unit cell 40. Exact dimensions would require circuit simulation of oscillator 10 and selection of specific FETs 16 and 18, for a particular operating frequency Typical dimensions 60, 62 and 64 are 20 microns, 20 microns and 6 microns, respectively. Overall feedback of oscillator 4 is determined by dimensions 58 and 66, the value of capacitors 22 and 24, and inherent coupling between grid lines 32 and 36. A contribution of coupled lines 32 and 36 or capacitor 22 or 24 to the feedback can be adjusted by varying dimensions 58, 60, 62 and 64 to provide a large, moderate or insignificant portion of oscillator coupling.

For instance, capacitor 22 or 24 can be made large so that it is a short at the frequency of oscillation or spacing 64 can be made large so there is a little coupling between lines 68 and 70. Similar dimensions would apply to integrated circuit unit section 40 in FIG. 4b incorporating bipolar transistors 17 and 19.

Oscillator grid array 20 is formed on substrate 112. Substrate 112 is typically gallium arsenide (GaAs) for the embodiment incorporating FETs 16 and 18 or bipolar transistors 17 and 19. First terminal lines 26 and 36, connected via lines 82 and 70, respectively, to the drains of FETs 16 and 18 or to the collectors of transistors 17 and 19, are deposited and of gold. Third terminal lines 28, connected to the sources of FETs 16 and 18 or to the emitters of transistors 17 and 19, are deposited and of gold. Second terminal lines 32 and 34 are connected via lines 68 and 88, respectively, to the gates of FETs 16 and 18 or to the bases of transistors 17 and 19, and are deposited and of gold. The proximity of lines 34 and 32 to lines 26 and 36, plus the capacitances resulting from the discrete capacitors indicated by 22 and 24, produce feedback for the purpose of sustaining the oscillation of unit oscillators 40. Lines 32 and 34 are bridged over lines 58 so as to avoid electrical contact with lines 58. Lines 26, 82, 58, 36 and 70 form a grid for emanating radiation 118 from unit oscillators 40 of array 20. Proximate to at distance 114 (in FIG. 3) from and parallel to substrate 112 is mirror 12 that reflects radiation 118 from array 20. Semi-reflecting mirror 14 reflects a portion of radiation 118 back towards array 20. Also, mirror 14 passes radiation out of device 30. The distances 114 and 116 are adjusted for the desired amount of emanated radiation and frequency of device 30.

All drain lines 26 and 36 are tied together to a common connection which is connected to a positive 5 to 6 volt direct current (DC) source through radio frequency (RF) chokes 120 and 126. All gate lines are likewise connected to a common connection which is connected to an approximately negative 2 volt bias through RF chokes 122 and 128. All source lines are connected to a common connection which is connected to a common ground reference through RF choke 124. Each set of lines on an integrated circuit are tied together at the edge of the array or chip.

Figure 5B:
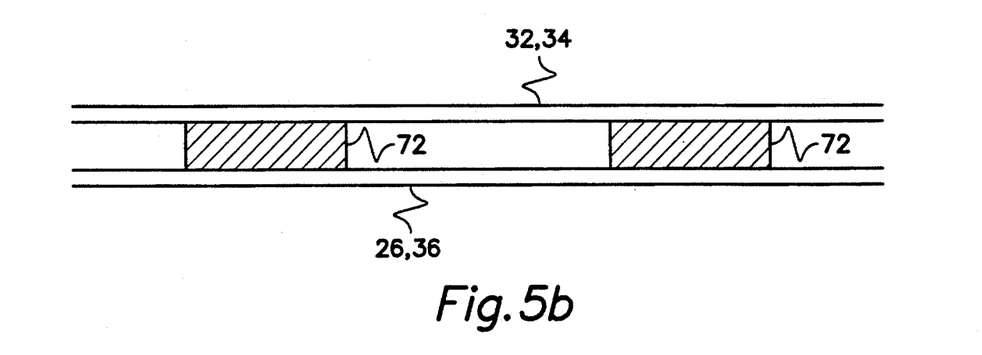

FIG. 5a illustrates a layout of capacitors 22 and 24 which have electrodes that are part of lines 26 and 34 and lines 36 and 32, respectively. FIG. 5b shows a side view of capacitors 22 and 24 and the position of lines 32, 34 and lines 26, 36 relative to each other. Capacitors 22 and 24 have a dielectric 72 between portions of lines or electrodes 26 and 34 and lines or electrodes 36 and 32, respectively, as illustrated in FIG. 5b. Dielectric 72 may be silicon nitride.

Figure 6:
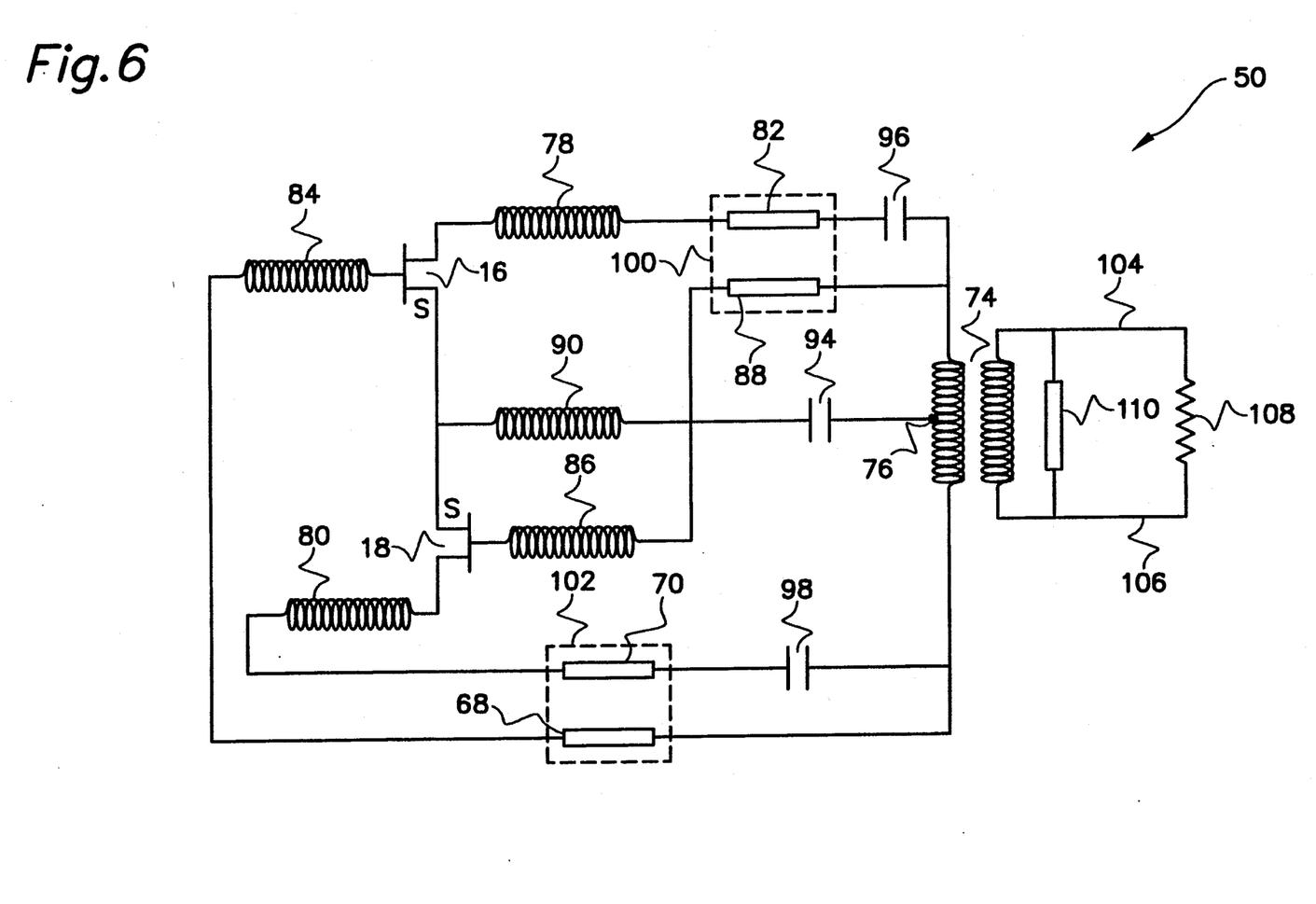
FIG. 6 is a schematic of the equivalent circuit of the unit cell oscillator.

FIG. 6 is a schematic of an equivalent circuit 50 of unit cell 40 in FIG. 4a. A schematic of the equivalent circuit of unit cell 40 in FIG. 4 would be similar. Center-tapped transformer 74 represents the coupling of oscillator 10 to free space through grid 20. Center tap 76 is the source bar 28 in grid 40. Inductances 78 and 80 are drain lead 70 and 82 inductances. Inductances 84 and 86 are gate lead 68 and 88 inductances. Inductance 90 and capacitance 94 represent the waveguide nature of unit cell 40. Capacitances 96 and 98 represent capacitors 22 and 24 having silicon nitride dielectric between portions of gate 32, 34 lines and drain 26, 36 lines of FETs 16 and 18, overlaying each other in unit cell 40. Coupled line pairs 100 and 102 represent the pairs of lines 82 and 88, and 68 and 70 in FIG. 4a. These lines are characterized by the line widths and spacing between lines given by dimensions 60, 62 and 64 in FIG. 4a. The coupled line pairs are modelled using these dimensions in commercially available circuit simulation software. Calculation of the lead inductance 90 and capacitance 94 may be determined with the following formulas. The equivalent circuit element values for inductor 90 and capacitor 94 due to the grid elements in the array can be calculated from formulas given by Popovic et. al. as follows below:

$$L_{90} = 1/j\omega \, (2/a)^2 \sum_{\substack{n \text{ odd} \\ m \text{ even}}} (1/k_{mn}^2)\text{sinc}^2(n\pi w/2a) \times$$

$$\text{sinc}^2(m\pi w/2a) \, ((m/n) + ((n/m) \cdot (a/a - w)))^2 Z_{mn}^{TE}$$

$$C_{94}^{-1} = j\omega \, (2/a)^2 \left[ \sum_{\substack{n=1 \\ n \text{ odd}}}^{\infty} (1/2k_{0n}^2) \, \text{sinc}^2(n\pi w/2a) \, Z_{0n}^{TM} + \right.$$

$$2 \sum_{\substack{n \text{ odd} \\ m \text{ even}}} (1/k_{mn}^2)\text{sinc}^2(n\pi w/2a) \cdot$$

$$\left. \text{sinc}^2(m\pi w/2a)((1 - (a/a - \omega))^2 Z_{mn}^{TM} \right]$$

where $k_{mn}^2 = (2\pi/\lambda)^2 - (m\pi/2a)^2 - (n\pi/2a)^2$, and $Z_{mn}^{TE}$ and $Z_{mn}$TM are the impedances of the mn-th TE and TM modes. The dimension a is the width of the unit cell designated as 52 in FIG. 4a. The dimension W is the width of lines 58 in FIG. 4a. Note that inductances 78, 84, 86 and 80 come from leads or bonding wires used to attach the FETs into the array.

With specific values known for equivalent circuit 50 elements and specific FETs (note that FETs 16 and 18 need not be identical), the coupling through capacitors 22 and 24, and coupled lines 68, 70, 32 and 36 are adjusted so that the impedance looking into the oscillator port at leads 104 and 106, where a 377 ohm load 108 is connected, is −377 ohms so that oscillation can occur. Load 110 (jB) is due to Fabry-Perot resonator mirror 12. The impedance presented by mirror 12 is determined by the spacing between mirror 12 and grid 20 and the dielectric constant of materials 112 between mirror 12 and grid 20.

Unit cell 40 of grid 20 may be fabricated on substrate material such as alumina or DUROID, using hybrid construction with discrete GaAs FETs 16 and 18, and capacitors 22 and 24 mounted on substrate 112. Metal grid lines 26, 28, 32, 34 and 36 may be made of copper or gold plated copper. Another approach is to use high resistivity silicon as a substrate 112 material having grid lines 26, 28, 32, 34 and 36, capacitors 22 and 24, and interconnects formed with silicon integrated fabrication processes. The active devices (typically GaAs FETs 16 and 18) can be mounted in etched wells in the silicon substrate 112 with wires connecting FETs 16 and 18 to grid and bias lines 26, 28, 32, 34 and 36. This approach is suitable for millimeter wave frequencies and offers a lower thermal resistance than GaAs.

Preferred construction is a monolithic implementation with GaAs or InP as a substrate 112 material. FETs 16 and 18 used for active array 20 elements 40 are fabricated on GaAs or InP substrate 112. Grid lines 26, 28, 32, 34 and 36 and FET 16 and 18 interconnections 68, 70, 82 and 88 are formed with gold lines deposited by thermal evaporation or by gold plating. Standard monolithic microwave integrated circuit (MMIC) capacitors having silicon nitride dielectric 72 are used for coupling capacitors 22 and 24. Conventional MMIC fabrication techniques can be used for all grid fabrication steps. The monolithic approach minimizes the size of parasitic elements in array 20. For example, since short metal lines on substrate 112 are used for FET 16 and 18 connections 68, 70, 82 and 88 instead of bond wires, wiring inductance is minimized. Further it may be desirable to use thick plated gold for drain connections 70 and 82 to heatsink FETs 16 and 18. Because of the FET layout in connections, there are currents flowing in opposite directions thereby cancelling out each other's effects.

Backside mirror 12 or ground plane can be a separate metal plate or a ground plane on the back of substrate material 112 used for oscillator grid 20. Partially transparent mirror 14 can be a dielectric material such as quartz or sapphire. If the array gain is high enough, no dielectric material is required (i.e., mirror 14 is fully transparent). In this case, grid 20 itself forms a resonant cavity with mirror 12. However, in practice, a mirror would be desirable to protect the array from the external environment.

I claim:

1. A power combining oscillator array comprising:
    a plurality of rows, each row having a plurality of unit oscillators wherein each unit oscillator comprises:
        first transistor having first, second and third terminals;
        a second transistor having first and second terminals, and having a third terminal connected to the third terminal of said first transistor;
        a first capacitor having a first terminal connected to the first terminal of said first transistor, and having a second terminal connected to the second terminal of said second transistor; and
        a second capacitor having a first terminal connected to the first terminal of said second transistor, and having a second terminal connected to the second terminal of said first transistor;
    a first first terminal line connected to the first terminal of said first transistor of each said unit oscillator;
    a second first terminal line connected to the first terminal of said second transistor of each said unit oscillator;
    a first second terminal line connected to the second terminal of said first transistor of each said unit oscillator;
    a second second terminal line connected to the second terminal of said second transistor of each said unit oscillator; and
    a third terminal line connected to the third terminals of said first and second transistors; and
    said each row of said plurality of rows of unit oscillators are interconnected with one another in that the second first terminal line of each said row is connected to the first first terminal line of another said row, the first second terminal line of each said row is connected to the second second terminal line of another said row, and each row is interconnected to at least one other row and to at most two other rows.

2. Power combining oscillator of claim 1 further comprising:
    a reflective mirror proximate to said plurality of rows; and
    a semi-transparent mirror proximate to said plurality rows such that said plurality of rows is situated between said reflective mirror and said semi-transparent mirror.

3. Power combining oscillator of claim 2 wherein:
    said plurality of rows is an oscillator array; and
    said oscillator array, said reflective mirror and said semi-transparent mirror are parallel to one another and are situated at certain distances from one another so as to result in a Fabry-Perot resonator.

4. Power combining oscillator of claim 3, wherein:
    said oscillator array is monolithically fabricated on a substrate;
    said oscillator array comprises:
        said first first, second first and third terminal lines of said plurality of unit oscillators, deposited on said substrate;
        said first second and second second terminal lines of said plurality of unit oscillators are formed on said substrate;
        said first and second transistors of said plurality of unit oscillators are formed on said substrate;
        said first first and second second terminal lines are in part proximate to each other and approximately parallel to each other and form in part said first capacitor of said plurality of unit oscillators; and
        said first second and second first terminal line are in part proximate to each other and approximately parallel to each other and form in part said second capacitor of said plurality of unit oscillators.

5. Power combining oscillator of claim 4, wherein:
    said transistors are field effect transistors, and the first, second and third terminals of said transistors are drain, gate and source terminals, respectively.

6. Power combining oscillator of claim 4, wherein:
    said transistors are bipolar transistors; and
    the first, second and third terminals of said transistors are collector, base and emitter terminals, respectively.

7. A power combining oscillator comprising:
    N pluralities of first and second transistors wherein each transistor has first, second and third terminals;
    N first lines wherein each first lines is connected to the third terminals of the transistors of one plurality of first and second transistors;
    N second lines wherein each second line is connected to the first terminals of the first transistors of one plurality of first and second transistors, and connected to the first terminals of the second transistors of another plurality of first and second transistors;
    N third lines wherein each third line is connected to the second terminals of the first transistors of one plurality and connected to the second transistors of another plurality; and
    each second line that is connected to the first terminals of the first transistors of one plurality of first and second transistors and connected to the first terminals of the second transistors of another plurality of first and second transistors, is capacitively coupled to a third line that is connected to the second terminals of the second transistors of said one plurality of first and second transistors and connected to the second terminals of the first transistors of said another plurality of first and second transistors.

8. Power combining oscillator of claim 7 wherein the second lines are at least part of a radiating antenna.

9. Power combining oscillator of claim 8 further comprising a mirror means proximate to the radiating antenna for forming a resonant cavity with the antenna.

10. Power combining oscillator of claim 9 wherein the N pluralities of first and second transistors, and N first, second and third lines are formed on a monolithic substrate.

11. Power combining oscillator of claim 10 wherein:
the transistors are field effect transistors; and
the first, second and third lines are connected to drains, gates and sources, respectively, of the field effect transistors.

12. Power combining oscillator of claim 10 wherein:
the transistors are bipolar transistors; and
the first, second and third lines are connected to collectors, bases and emitters, respectively, of the bipolar transistors.

13. A power combining oscillator comprising:
antenna means for radiating electromagnetic energy, wherein said antenna means comprises a plurality of first conducting means for conducting current;
a plurality of oscillating means, connected to the plurality of first conducting means, for generating oscillation signals to be emanated by said antenna means;
a plurality of second conducting means, connected to said plurality of oscillating means and capacitively connected to the first plurality of conducting means, for feeding back oscillation signals from the first conducting means to said plurality of oscillating means;
a plurality of third conducting means, connected to said plurality of oscillating means, for sustaining operation ability of said oscillating means; and
a mirror means, proximate to said antenna means, for forming a resonant cavity with said antenna means; and
wherein:
said power combining oscillator is formed on an integrated circuit;
the dimensions of and the distances among first, second and third pluralities of conducting means determine a resonant frequency and an amount of feedback for sustaining oscillations of said plurality of oscillating means;
said power combining oscillator is capable of emanating electromagnetic radiation at frequencies greater than 30 gigahertz; and
said plurality of oscillating means is an array of unit oscillators, each unit oscillator comprising a plurality of transistors having a feedback loop sufficient to sustain oscillation of the unit oscillation.

* * * * *

UNITED STATES PATENT AND TRADEMARK OFFICE
CERTIFICATE OF CORRECTION

PATENT NO. : 5,317,286
DATED : May 31, 1994
INVENTOR(S) : JOHN J. GEDDES

It is certified that error appears in the above-indentified patent and that said Letters Patent is hereby corrected as shown below:

Column 2, item [57],
on the title page, in the ABSTRACT
delete "oscillators, radiation" and replace with
--oscillators' radiation.--

Signed and Sealed this

Twelfth Day of September, 1995

Attest:

BRUCE LEHMAN

Attesting Officer  Commissioner of Patents and Trademarks